United States Patent [19]
Hori et al.

[11] Patent Number: 4,873,673
[45] Date of Patent: Oct. 10, 1989

[54] DRIVER CIRCUIT HAVING A CURRENT MIRROR CIRCUIT

[75] Inventors: Ryoichi Hori, Tokyo; Kiyoo Itoh, Higashikurume; Goro Kitsukawa, Tokyo; Yoshiki Kawajiri, Hachioji; Takao Watanabe; Takayuki Kawahara, both of Kokubunji, all of Japan

[73] Assignee: Hitachi, Ltd., Tokyo, Japan

[21] Appl. No.: 126,485

[22] Filed: Nov. 30, 1987

[30] Foreign Application Priority Data

Dec. 3, 1986 [JP] Japan .................................. 61-286610
Feb. 20, 1987 [JP] Japan .................................. 62-35519
Jul. 8, 1987 [JP] Japan .................................. 62-168652

[51] Int. Cl.⁴ .......................... G11C 8/00; G11C 7/00; H03K 3/01
[52] U.S. Cl. ................................ 365/230.06; 365/205; 330/288; 323/316; 307/270
[58] Field of Search ................ 365/227, 205, 230, 189; 307/270; 323/317, 316, 315, 312, 314, 274, 275, 280; 330/257, 288

[56] References Cited

U.S. PATENT DOCUMENTS

| | | | |
|---|---|---|---|
| 4,399,399 | 8/1983 | Joseph | 323/316 X |
| 4,412,186 | 10/1983 | Nagano | 323/316 X |
| 4,482,985 | 11/1984 | Itoh et al. | 365/226 |
| 4,560,921 | 12/1985 | Yamatake | 323/316 |
| 4,591,739 | 5/1986 | Nagano | 323/315 X |
| 4,593,338 | 6/1986 | Takeda et al. | 323/275 X |
| 4,703,249 | 10/1987 | De La Plaza et al. | 323/280 X |

OTHER PUBLICATIONS

Extended Abstracts of the 18th (1986 International) Conference on Solid State Devices and Materials, Aug. 20-22, 1986, pp. 307-310.

*Primary Examiner*—Stuart N. Hecker
*Assistant Examiner*—Andrew L. Sniezek
*Attorney, Agent, or Firm*—Antonelli, Terry & Wands

[57] ABSTRACT

A semiconductor device is provided wherein a current mirror circuit controlled by a pulse input voltage is utilized and a load is driven in such a manner that the output current of the current mirror circuit becomes a substantially constant current. Further, the output voltage of the current mirror circuit can be compared with a predetermined reference voltage by a comparator, with the current mirror circuit being controlled by the output voltage of the comparator in accordance with the result of comparison. The driver circuit can be used for driving the data lines of a dynamic random access memory or an external capacitance load. With these techniques, power consumption and peak current are reduced.

11 Claims, 14 Drawing Sheets

DRIVER CIRCUIT HAVING A CURRENT MIRROR CIRCUIT

BACKGROUND OF THE INVENTION

This invention relates to a semiconductor device and more particularly to a driver circuit which is suitable for reducing a peak current or for controlling the output voltage.

Conventionally, there has been the problem in that a peak current becomes excessively great when a large load capacitance is charged and discharged at a high speed. In a dynamic random access memory (hereinafter called "DRAM") using dynamic memory cells, for example, an excessively large peak current that develops when a large number of data lines are altogether charged and discharged has been the problem. To cope with this problem, a voltage limiter circuit system such as one described in "'86 International Conference On Solid State Devices and Materials", Digest, pp. 307-310, has been proposed.

SUMMARY OF THE INVENTION

In the prior art system described above, the data lines are charged by an internal power source voltage which is obtained by reducing an external power source voltage on a chip. Therefore, though the current is reduced by effectively reducing the power source voltage, charge is left as such.

In addition, there is an inevitable limit to the reduction of the current because the prior art system does not employ any positive means for controlling the change of a charge peak current that varies in response to the change of drivability of MOS transistor resulting from the fluctuation of its gate length or threshold voltage due to the fluctuation of the fabrication process.

The present invention contemplates to improve the prior art technique described above.

The object of the invention described above can be accomplished by using a current mirror circuit as a driver whose output current can be made constant in response to a constant current source inside the current mirror circuit.

Furthermore, the present invention reduces the peak current by controlling the current value of the constant current source inside the current mirror circuit by a power source voltage and by the gate length $L_g$ and threshold voltage $V_t$ of an MOS transistor.

The current mirror circuit is not affected so easily by the fluctuation of process conditions and can therefore reduce the peak current.

Since a voltage limiter is employed, a low constant voltage can be obtained and power consumption can be reduced.

Since the current value of the constant current source inside the current mittor circuit can be controlled by the gate length $L_g$ and threshold voltage $V_t$ of the MOS transistor, the peak current can be reduced.

Accordingly, it is an object of the present invention to provide a driver circuit which effects charge and discharge of a load capacitance by an arbitrary predetermined constant current.

It is another object of the present invention to provide a semiconductor device which can reduce a peak current irrespective of the fluctuation of fabrication process.

It is still another object of the present invention to provide a semiconductor device which can reduce a peak current and power consumption through the combination with a voltage limiter circuit.

It is still another object of the present invention to provide a constant current source whose current value does not change so easily due to the fluctuation of fabrication process or to the change of a power source voltage.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Hereinafter, some preferred embodiments of the present invention will be described in detail.

Embodiments Nos. 1 to 9 illustrate the embodiments of driving circuits using a current mirror circuit while Embodiments Nos. 10 to 15 relate to the improvement in a constant current source in the current mirror circuit. Therefore, any of the constant current circuits disclosed in Embodiments Nos. 10 to 15 can be applied as the constant current source in the current mirror circuits disclosed in Embodiments Nos. 1 to 9.

[Embodiment 1]

Figure 1:
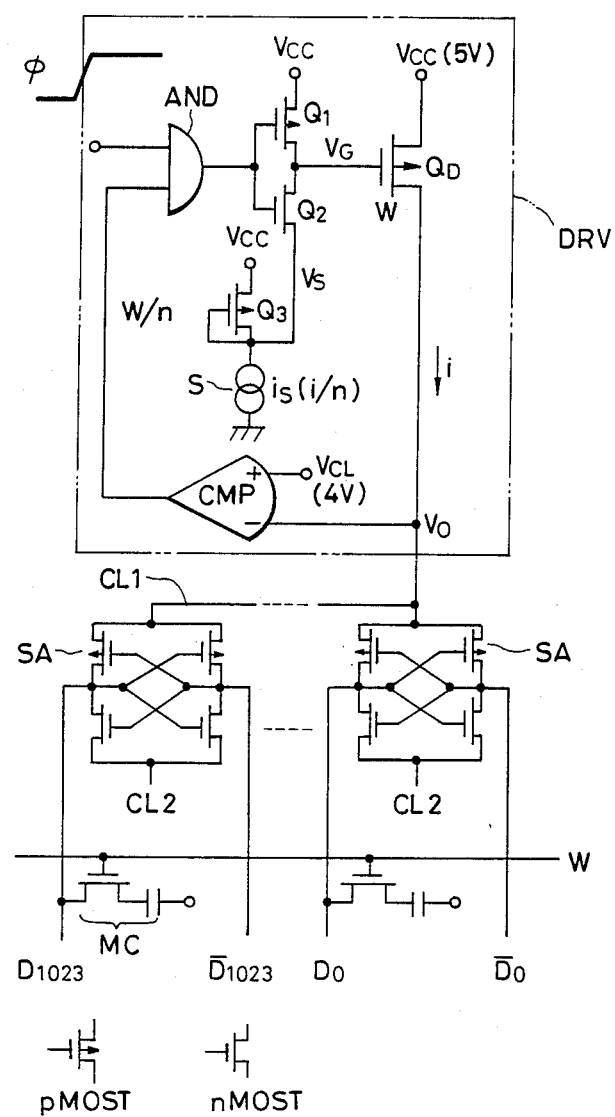
FIG. 1 is a circuit diagram showing the first, embodiment of the present invention.
Figure 2:
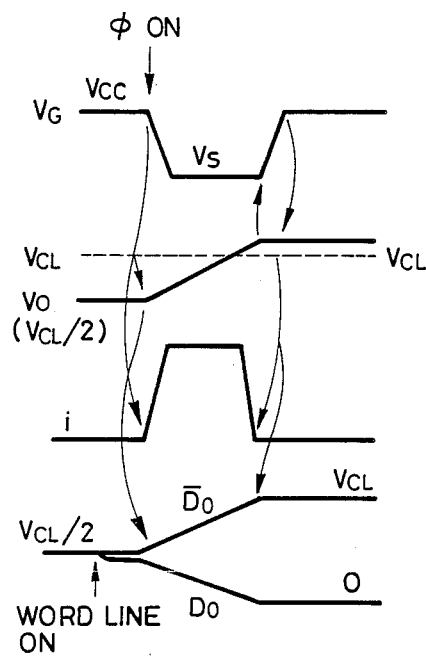
FIGS. 2 and 3 is a diagram useful for explaining a specific operation of the present invention.

The first embodiment of the present invention and its waveform will be explained with reference to FIGS. 1 and 2, respectively.

In DRAM, one of memory cells MC (each consisting of one MOST and one capacitor, for example) disposed at the point of intersections between a word line W and a data line pair $D_o$, $\bar{D}_o$ is selected and the data line pair is amplified by a well known sense amplifier SA consisting of p-MOST in accordance with this read-out information. In the case of the latest 1-mega bit DRAM, 1024 pairs of data lines must be charged simultaneously at a high speed. The total capacitance of these data lines is as great as 500~1,000 pF and hence a peak current becomes a problem. This charging operation is made by a driver circuit DRV connected to a common driving line CL1 of a flip-flop as the sense amplifier constituted by p-MOST. This embodiment is characterized in that the driver circuit DRV consists of a current mirror circuit and a comparator CMP. The current mirror circuit is controlled by a kind of inverter consisting of MOS transistors $Q_1$ and $Q_2$. When the MOS transistor $Q_2$ is ON and $Q_1$ is OFF, the current mirror circuit is formed between an MOS transistor $Q_3$, a constant current source S (i/n) and an output driver MOS transistor $Q_D$. When the MOS transistor $Q_2$ is OFF and the MOS transistor $Q_1$ is ON, on the other hand, the output driver MOS transistor $Q_D$ is OFF. The ON current of this transistor $Q_D$ becomes a constant current i if the current of the current source S in the current mirror circuit is $i_s = i/n$, the gate width of the MOS transistor $Q_3$ is w/n and the gate width of the output driver MOS transistor $Q_D$ is W. The driving current of $Q_D$ can be kept substantially constant by keeping constant the current $i_s=i/n$ of the constant current source S, even when the gate width w and gate length and the threshold voltage of the transistor vary due to fluctuation of fabrication process. Here, the reason why the current $i_s$ of the constant current source is set to i/n and the gate width of the MOS transistor $Q_3$ is set to w/n is for the purpose of reducing the consumed current as well as the occupying area, and the value n is preferably greater. Here, symbol n represents the current ratio of the current mirror circuit and is given by $n=i/i_s$.

The comparator CMP is disposed in order to compare a predetermined internal power source voltage $V_{CL}$ (e.g. 4V) with the output voltage $V_o$. If $V_{CL}>V_o$, the output of the comparator CMP becomes a high voltage and if $V_{CL}<V_o$, on the contrary, it becomes a low voltage. Incidentally, $V_{CL}$ may be generated from $V_{DD}$ (externally supplied power source voltage) inside the chip.

Under the preparation described above, the operation will now be explained.

Ordinary DRAMs are of the type wherein the data line pair is set to a value almost the half of $V_{CL}$ during the stand-by operation, or of the so-called "half precharge type". Therefore, the common driving line CL1 or all the data line pairs are precharged to $V_{CL}/2$. When a pulse is applied to the selected word line W under this state, read signals having a small difference appear on each data line pair $D_o$, $\overline{D}_o \sim D_{1023}$, $\overline{D}_{1023}$. This state is illustrated typically in FIG. 2 by the data line pair $D_o$, $\overline{D}_o$ arranged symmetrically with each other. Thereafter, the lower voltage side is discharged to 0 V by the sense amplifier SA consisting of n-MOST and p-MOST while the high voltage side is charged to $V_{CL}$. Discharge is effected by applying a low voltage pulse to the common driving line CL2 of each n-MOST. However, the following description will deal only the case where charge is made by the pulse applied to the common driving line CL1 of p-MOST.

CL1 is driven when the input pulse $\phi$ is applied to the AND gate. When the input pulse $\phi$ is ON (the high voltage is inputted), the output voltage of the control circuit AND becomes the high voltage, the gate voltage $V_G$ of $Q_D$ becomes the output voltage $V_S$ of the constant current source S and $Q_D$ drives the load by a constant current i. As a result, the voltage $V_o$ of the load rises from $V_{CL}/2$ at a predetermined rate but when it exceeds $V_{CL}$, the comparator CMP operates and the output of the control circuit AND becomes the low voltage so that $Q_1$ is ON, $Q_2$ is OFF, $Q_D$ is OFF and $V_o$ is clamped substantially to $V_{CL}$. Therefore, one of the data lines of each data line pair is charged substantially from $V_{CL}/2$ to $V_{CL}$.

According to the embodiment described above, the data lines can be charged by a substantially constant current so that they can be charged at a high speed without the increase of the peak current. In addition, the influence of the fluctuation of the power source voltage $V_{cc}$ and fabrication process can be minimized by keeping constant the current $i_s$ of the constant current source. Furthermore, since the data line voltage is kept at a low level, consumed power can be reduced, as well.

As described above, the data lines can be charged by a substantially constant current by the driver circuit using the current mirror circuit. In order to obtain a constant current from this current mirror circuit, it is preferred that the driver MOS transistor $Q_D$ be driven in the saturation region ($|V_o-V_{cc}| \geq |V_s-V_{cc}-V_T|$).

Figure 3:
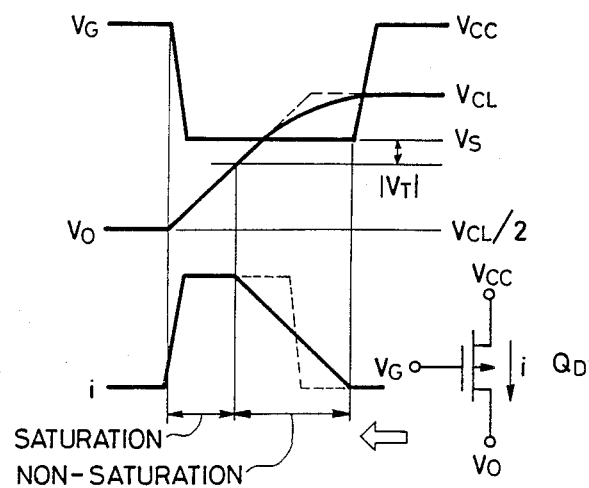

As shown in FIG. 3, however, there is the case where this condition cannot be satisfied with the passage of time depending on the operation conditions, or the like. In other words, when the potential of $V_o$ rises from $V_{CL}/2$ and becomes higher than the voltage $V_s-|V_T|$ (where VT is the threshold voltage of $Q_D$ and has generally a negative value because it is of a p-channel type), the following relation is established:

$$|V_o-V_{cc}|<|V_s-V_{cc}-V_T|$$

Accordingly, MOS $Q_D$ operates in the non-saturation region. As a result, the current i becomes small and the time before $V_o$ reaches $V_{CL}$ (4 V) becomes long. Even if the driver MOS transistor $Q_D$ operates in the saturation region, the problem similar to the one described above will occur when the channel length becomes shorter and shorter in future because the dependence of the drain current on the drain-source voltage becomes remarkable.

[Embodiment 2]

Figure 4:
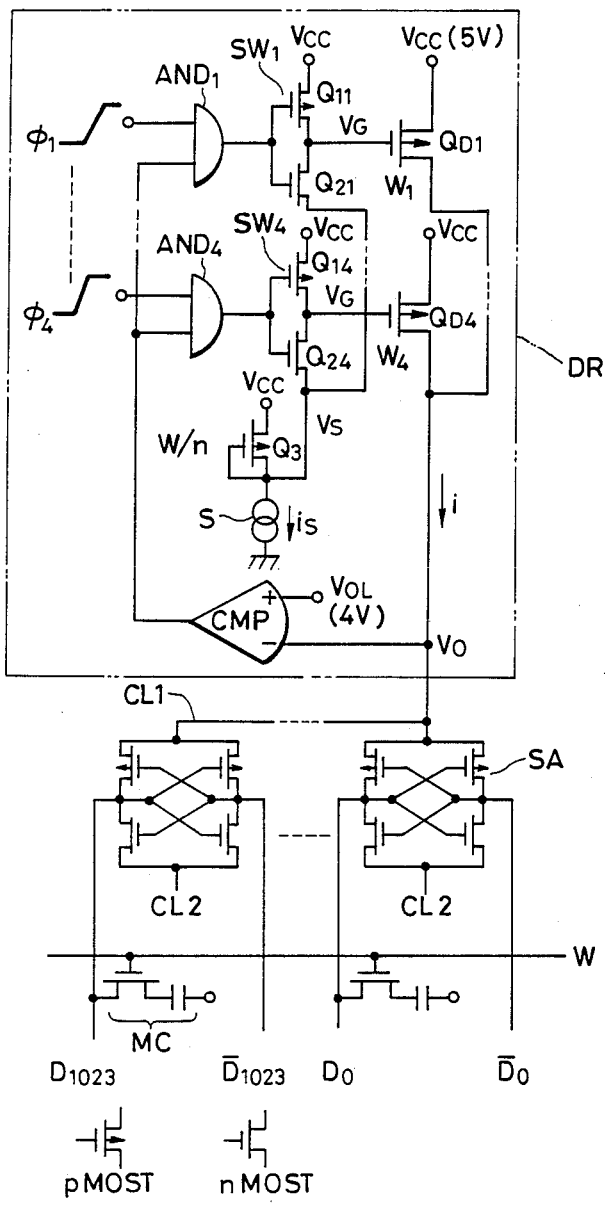
FIGS. 4 and 5 are explanatory views of the second embodiment of the present invention.

FIG. 4 shows the second embodiment of the present invention which solves the problem described above and can accomplish better constant current charging.

Figure 5:
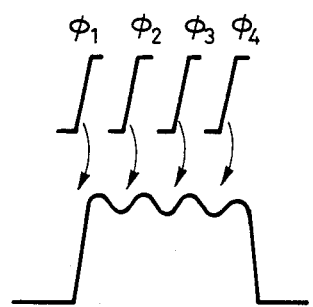

In this embodiment, m (here, m=4, by way of example) driver MOS transistors $Q_D$ are disposed to constitute a current mirror circuit and are sequentially ON with the passage of time to provide a constant current. As shown in FIG. 5 which shows the waveforms of the circuit, the gates of $Q_{D1} \sim Q_{D4}$ are sequentially connected to $V_s$ by $AND_1 \sim AND_4$ and $SW_1 \sim SW_4$ consisting of a kind of CMOS inverter by applying sequentially $\phi_1 \sim \phi_4$ so as to drive the driver MOS transistors $QD_1 \sim QD_4$. In this manner, drivability is increased with the passage of time to provide a constant current. Thereafter, the comparator CMP detects the arrival of $V_o$ at $V_{CL}$ in the same way as in FIG. 1 and the driver MOS transistors $QD_1 \sim QD_4$ are turned OFF to stop the operation. In this manner, the data line voltage is set substantially to $V_{CL}$.

According to this embodiment, the current i can be kept substantially constant during the entire period of operation by selecting a suitable gate width value for each of the driver MOS transistors $Q_{D1} \sim Q_{D4}$. Incidentally each driver MOS transistor $Q_{D1} \sim Q_{D4}$ has originally the current mirror structure, the output current it can be kept constant and the influence of the fluctuation of fabrication process, and the like, can be minimized.

[Embodiment 3]

Figure 6:
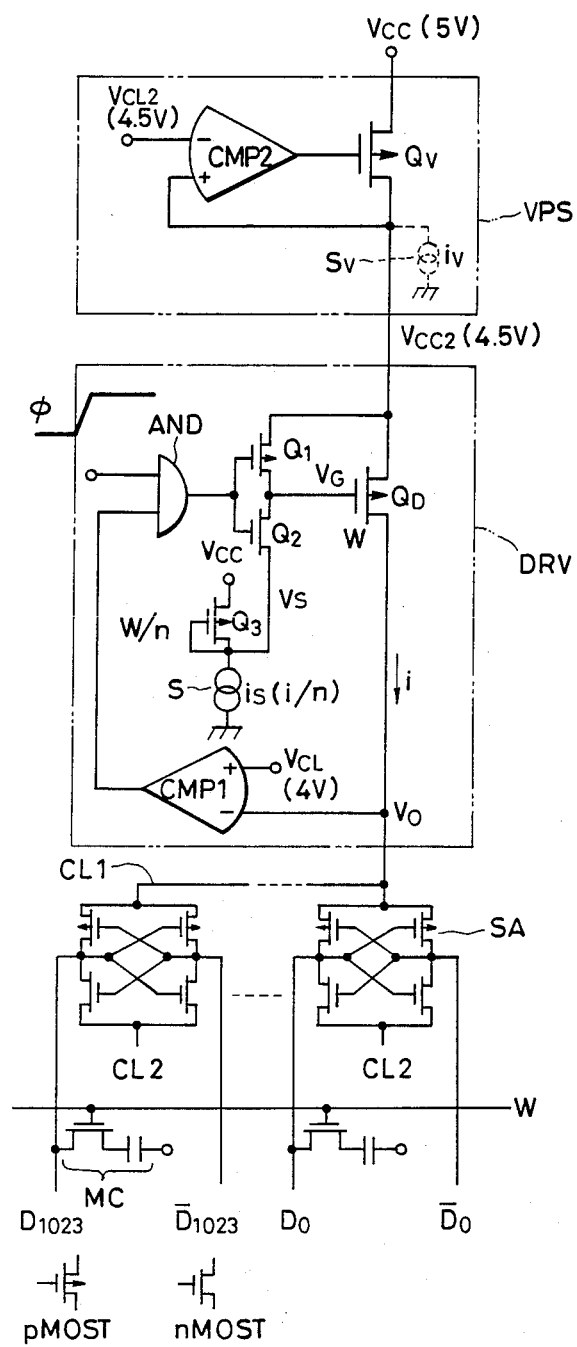

FIG. 6 shows the third embodiment of the present invention which is further suitable for keeping constant the current i. In this embodiment, the operation is made by the internally supplied voltage obtained by converting an externally supplied power source voltage $V_{cc}$, e.g. 5 V, to a predetermined voltage, e.g., $V_{cc2}$ of 4.5 V, by use of a voltage converter disposed inside the chip.

The voltage convertor VPS of this embodiment is constituted by the circuit described, for example, in Papers of Institute of Electronics, Information and Communication Engineers of Japan, Div. 2, item 244. This circuit is characterized by including a comparator CMP2 for comparing the output voltage $V_{cc2}$ with a comparison voltage $V_{CL2}$ (4.5 V) so that the current flowing through an MOS transistor $Q_v$ can be controlled by applying the output voltage of the comparator CMP2 to the gate of this transistor $Q_v$ and negative feedback is effected in order to keep the output voltage $V_{cc2}$ equal to $V_{CL2}$. Incidentally, the current source $S_v$ represented by dash line in the drawing is a bias current for keeping accurately constant the output voltage $V_{cc2}$ even when DRV is OFF and the output current of VPS is zero. This may be disposed or need not be disposed, depending on the intended application. It is also possible to employ the system wherein the current iv is caused to flow in synchronism with the operation of DRV when DRV is OFF, for example, and is made zero when DRV is ON.

In accordance with this embodiment, since DRV operates always at the constant current $V_{cc2}$, the output current of DRV can be kept constant irrespective of the fluctuation of the power source voltage. Various modifications can be made for the VPS circuit besides the circuit shown in this embodiment, and the voltage convertors disclosed, for example, in JPA Nos. 58-70482, 59-111514, U.S. Pat. No. 4,482,985, and the like, can be used as such. Therefore, refer to these prior art references for the detail of the VPS circuit.

[Embodiment 4]

Figure 7:
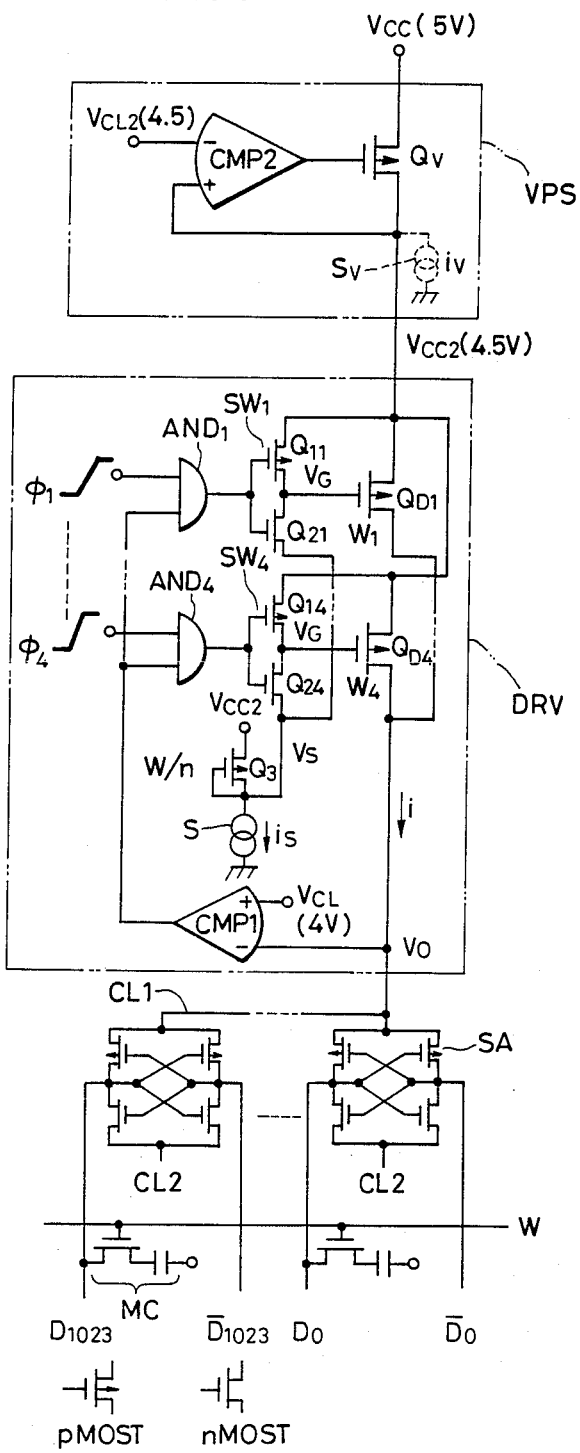

FIG. 7 shows the fourth embodiment of the present invention wherein the embodiment shown in FIG. 6 is applied to the embodiment shown in FIG. 4. This embodiment can keep constant the output current i irrespective of the fluctuation of the power source voltage $V_{cc}$ and without any influences of the fluctuation of the operation region of the MOS transistors.

[Embodiment 5]

Figure 8:
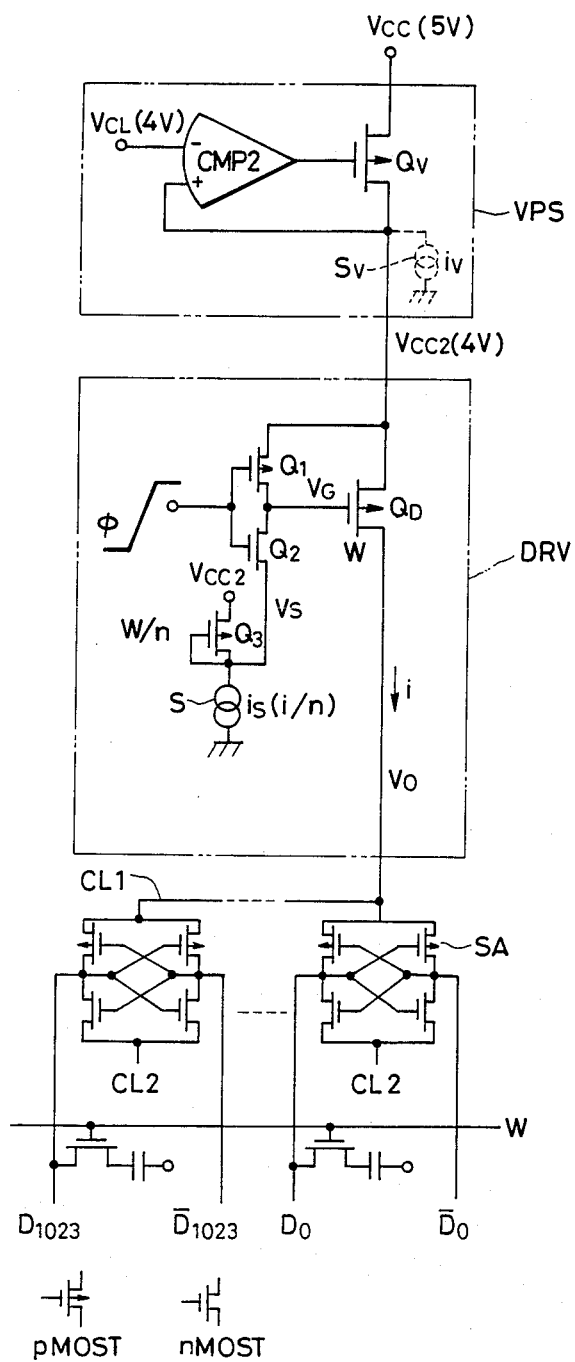

FIG. 8 shows the fifth embodiment of the present invention. In the embodiment shown in FIG. 6, $V_{cc2}$ is set to a desired data line voltage, e.g. 4 V, in this embodiment so that the function of DRV as the voltage limiter is borne by VPS and DRV is caused to operate only as the current limiter. Therefore, the components or portions inside DRV necessary for voltage setting such as the voltage comparator (CMP 1 in FIG. 7) are removed.

In accordance with this embodiment, the data line voltage and the current at the time of charging are controlled by VPS and DRV, respectively. For this reason, this embodiment can keep constant the output current i without any influence of the fluctuation of the power source voltage $V_{cc}$ in the same way as the third embodiment shown in FIG. 6 but by use of the more simplified circuit construction.

[Embodiment 6]

Figure 9:
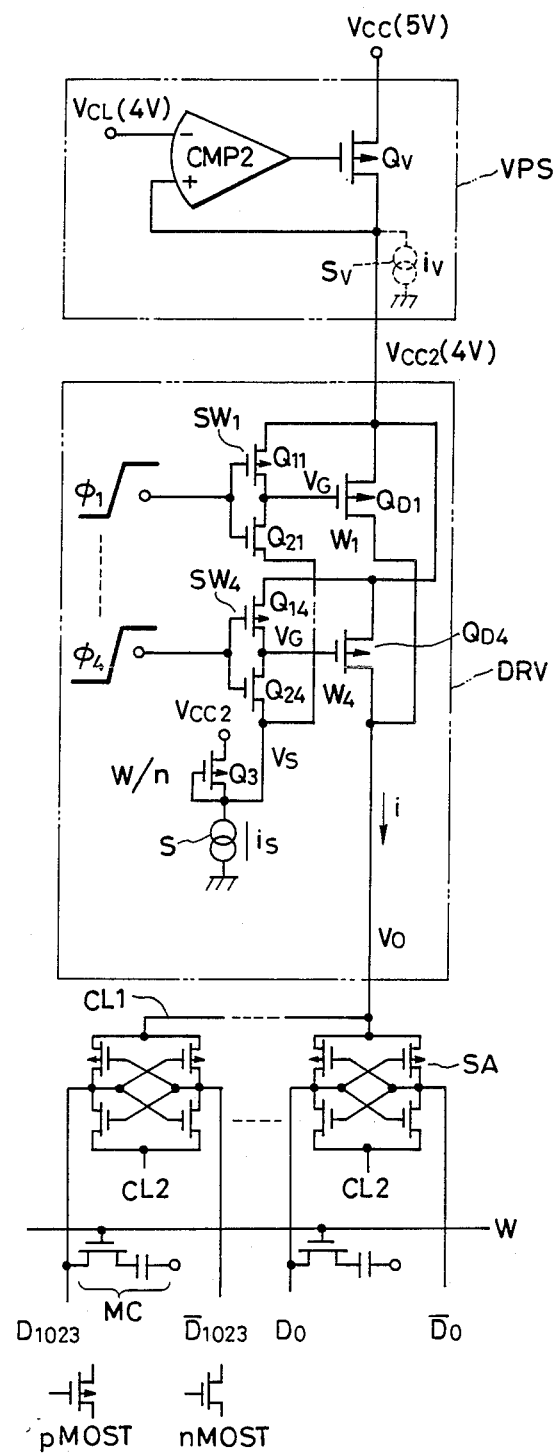

FIG. 9 shows the sixth embodiment of the present invention. In the fourth embodiment of the invention shown in FIG. 7, $V_{cc}$ is set to a desired data line voltage, e.g. 4 V, in this embodiment and the voltage is limited by VPS to remove the voltage limiter function of DRV in the same way as the fifth embodiment described above. This embodiment, too, can keep the output current constant without being affected by the influences of the power source voltage and the operation region of the MOS transistors by the more simplified circuit in the same way as in the embodiment described above.

[Embodiment 7]

Next, the seventh embodiment of the invention, which is suitable for turning ON and OFF the current mirror circuits shown in FIGS. 1, 4 and 6 to 9 at a high speed, will be explained with reference to FIG. 10.

As described already, the data line capacitance to be charged is as great as from 500 to 1,000 pF in a 1-mega bit DRAM, for example. Therefore, the gate 17 width of MOS $Q_D$ (shown in FIGS. 1, 6, 8) or $Q_{D1} \sim Q_{D4}$ (shown in FIGS. 4, 7, 9) becomes extremely great. If the gates of these MOS transistors are connected directly to the constant current source, the excessive discharge current of the gate capacitance of each MOS flows into the constant current source and the normal operation becomes difficult because the value $V_s$ fluctuates drastically.

Figure 10:
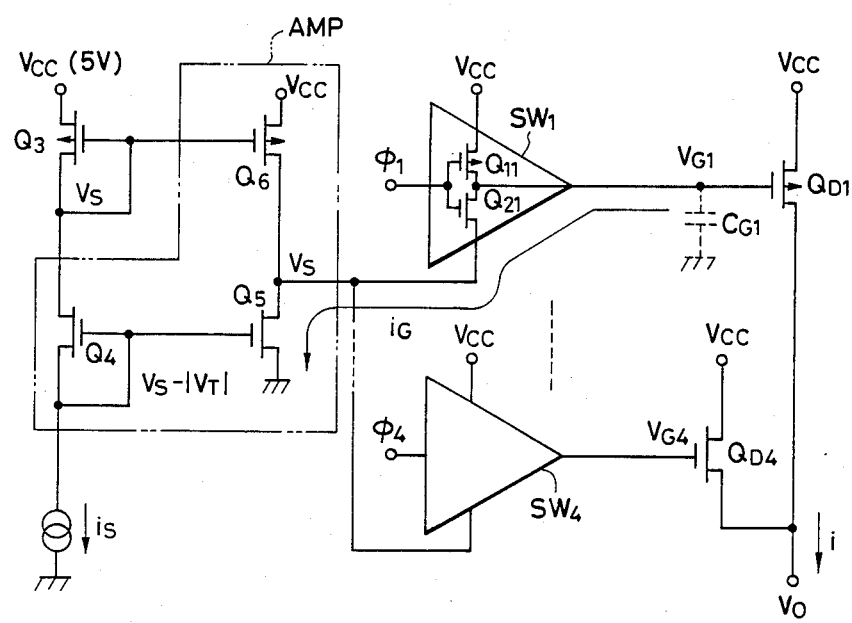
FIGS. 6 through 21 are explanatory views useful for explaining the third through fifteenth embodiments of the present invention, respectively.

To solve this problem, the embodiment shown in FIG. 10 is equipped with a current amplification circuit consisting of p-channel MOS transistors $Q_4$ through $Q_6$.

In the drawing, the transistor $Q_4$ inserted between $Q_o$ and the constant current source generates a voltage $V_s - |V_T|$ and the value $V_s$ is outputted to the source of $Q_5$ using this voltage as the gate voltage. Here, the transistor $Q_6$ provides the operation current of $Q_5$. The source voltage of $Q_5$ is applied to the gates of the MOS transistors $Q_{D1}$ through $Q_{D4}$ through the CMOS inverter. In other words, $V_{cc}$ is applied to the gates of $Q_{D1} \sim Q_{D4}$ when $\phi_1 \sim \phi_4$ are at the low potential and the transistors are OFF. When $\phi_1$ is at the high potential, $Q_{11}$ is OFF while $Q_{21}$ is ON, so that $V_s$ is applied to $Q_{D1}$ through $Q_{21}$. As a result, $Q_{D1}$ is turned ON and the charging operation of the data lines is started. Though the discharge current of the gate capacitance $C_{G1}$ of $Q_{D1}$ flows into $Q_5$ at this moment, the fluctuation of the source voltage or the fluctuation of $V_s$ can be reduced by setting the gate width of $Q_5$ to a large value. $Q_{D2} \sim Q_{D4}$ are actuated in the same way. According to this embodiment, the current mirror circuit can be actuated at a high speed without affecting at all the constant current source. Since the current $I_G$ flows only at the time of discharge of $C_{G1}$, consumed power can be reduced, too, by designing the current $i_s$ of the constant current source and the current flowing through $Q_6$ to small values. Incidentally, in order to further improve controllability of the fluctuation of the fabrication condition, it is possible to employ a construction wherein a plurality of MOS transistors $Q_3$ are further connected in series in the current mirror circuit.

The embodiment described above illustrates an example for obtaining the constant current by the combination with the voltage limiter using the comparator. When the voltage limiter is not used (where the output loop of the comparator does not exist), too, control of the mirror circuit can be made by use of the input pulse $\phi$ such as the DRV in the embodiments shown in FIGS. 8 and 9 so that the constant current can be obtained, too. A circuit using known bipolar transistors can be used suitably as the constant current source. It is of course possible to use the later-appearing improved constant circuit. Since the output $V_o$ can be brought closer unlimitedly to $V_{CL}$ with a faster response time of the output $V_o$, it is possible from time to time to constitute the comparator by use of those bipolar transistors which are suitable for a high speed operation. A circuit such as DRV2 shown in FIG. 11 can be used for driving the common drive line Cl2 of the sense amplifier consisting of nMOSTs. In this manner, the charge waveform and the discharge waveform can be controlled arbitrarily. If both waveforms are made completely complementary to each other, the noise coupled from the data lines to other conductors (e.g. the Si substrate, the word lines, etc.) can be offset completely and a memory having a broad operation margin can be designed.

[Embodiment 8]

Figure 11:
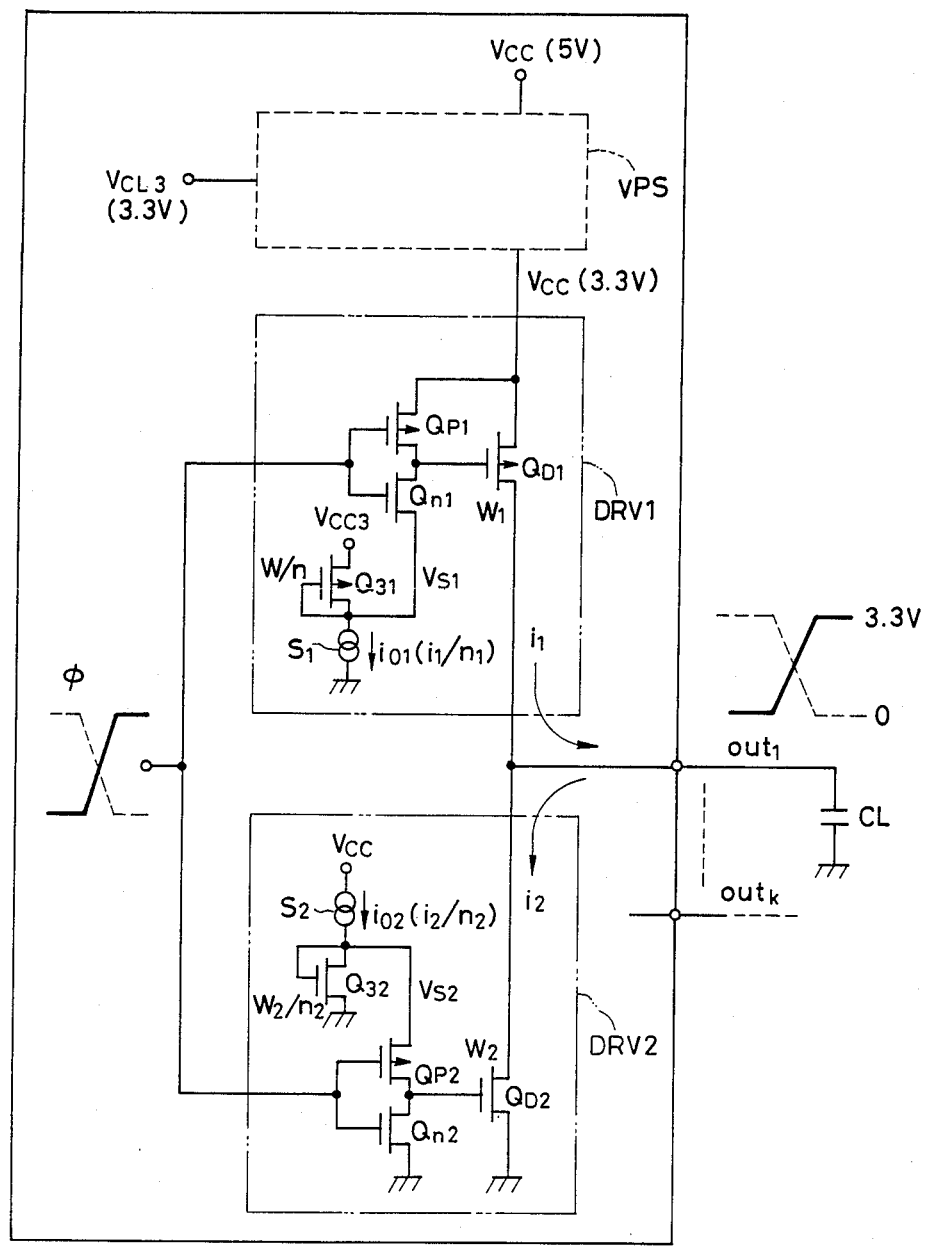

The application of the present invention is not particularly limited to the application of the data line charge circuit of DRAM but can be employed effectively as the counter-measure for the peak current when applied to the data output portion of all the memories having a multi-bit structure (where a plurality of data outputs are produced from one chip) where the peak current becomes a particular problem or to the address output portion or data output portion of microcomputers, and the like. FIG. 11 shows an example of such an application, wherein the load capacitance CL outside the chip is driven at a constant voltage and a constant current to reduce the peak current. Namely, the voltage and current are limited by use of VPS and DRV shown in FIG. 8 at the rise of the output, while the current is limited by DRV2 having exactly the complementary voltage relation inside DRV and complementary MOS transistors at the fall of the output. This DRV2, too, operates in exactly the same way as DRV1 with the exception that the potential relationship is opposite. In other words, $Q_{32}$ and $Q_{D2}$ together constitute a current mirror circuit and this current mirror circuit is controlled by a kind of inverter consisting of transistors $Q_{p2}$ and $Q_{n2}$ in the same way as described already. When $Q_{p2}$ is ON and $Q_{n2}$ is OFF, the current mirror circuit is formed between the transistor $Q_{32}$, the constant current source $S_2$ ($i_2/n_2$) and the output driving transistor $Q_D$ and when $Q_{p1}$ is OFF and $Q_{n1}$ is ON, $Q_{D2}$ is OFF. The ON current of $Q_{D2}$ becomes a constant current $i_2$ if the current value of the current source inside the current mirror circuit is $i_2/n_2$, the gate width of MOST is $w_2/n_2$ and the gate width of $Q_{D2}$ is $W_2$. Even when the value $w_2$ or the gate length or the threshold voltage of the transistor changes due to the fluctuation of the fabrication process, the driving current of $Q_{D2}$ becomes substantially constant if the ratio $i_2/n_2$ is kept constant. Here, the constant current source is set to $i_2/n_2$, $w_2/n_2$ in order to reduce consumed current and the occupying area. Preferably, $n_2$ has a large value.

In VPS of this embodiment, $V_{CL3}$ is 3.3 V and the output $V_{cc3}$ is 3.3 V, too, for the following reason. Namely, assuming the case where IC or LSI of the next stage which operates using, as its input, the outputs Out 1~Out k of the chip operates at the known TTL interface level, these voltages are set to substantially the lowest level which is permissible as the highest potential level, in order to restrict the charge/discharge current of the load capacitance. Therefore, the values should be set in accordance with the intended application and should not be limited to this embodiment, in particular.

In this embodiment, when $\phi$ generated by the circuit inside the chip is at the high potential, DRV1 is ON and DRV2 is OFF and when $\phi$ is at the low potential, DRV1 is OFF and DRV2 is ON so that the constant current $i_2$ flows from the load towards the ground inside the chip. Therefore, when $\phi$ changes from the low potential to the high potential (as represented by solid line in the drawing), DRV1 is ON and CL is charged by the constant current $i_1$ and when the high potential of the output reaches 3.3 V, $i_1$ becomes 0. When $\phi$ changes from the high potential to the low potential (as represented by dash line in the drawing), DRV2 is ON and CL is discharged from 3.3 V towards 0 V by the constant current $i_2$.

In accordance with this embodiment, charge/discharge of the load capacitance is effected by the constant current so that CU can be driven at a high speed without increasing the peak current In this embodiment, driver circuits DRV1 and DRV2 of the foregoing embodiments can be employed properly in accordance with the intended applications For example, it is possible to accomplish further a constant current by use of a system which drives by a multi-layered pulse such as shown in FIGS. 4, 7 and 9. Though $V_{cc3}$ is set to 3.3 V in VPS, it can be set to other arbitrary values. Alternatively, it is possible to directly drive VPS by $V_{cc}$ to increase the output voltage.

The peak current can be reduced further by disposing a circuit similar to VPS on the low potential side to increase the low potential of the output above 0 V and to reduce the output amplitude. Moreover, the relation of the operation voltage of each circuit inside the chip can be set arbitrarily. For example, it is possible to operate each circuit inside the chip and the output stage at the same low voltage $V_{cc3}$ in order to reduce the power and the peak current, as well. Alternatively, it is possible to operate only the output stage at the low voltage so as to reduce the charge/discharge current of the output load capacitance. It may be possible further to operate the internal circuit by $V_{cc2}$ and the output stage by $V_{cc}$ in the manner quite opposite to the above.

Though this embodiment employs the circuit construction wherein DRV1 and DRV2 are operated by the same pulse and any one of them is always ON. However, it is also possible to drive them by separate pulses, respectively, so as to turn one of them ON and to output a high or low potential output, or to employ a so-called "3-level output type" driver circuit wherein both of them are turned OFF and the output is under the floating condition. Though this embodiment explains the case where the external load capacitance is driven, it can be applied as such to the case where a large load capacitance inside the chip is driven. Though this embodiment represents the case where constant current driving is effected for both charge and discharge, only one of them can be driven by the constant current. Though DRV1 or DRV2 is constituted primarily by MOS transistors in this embodiment, it is possible to constitute the current mirror circuit by use of bipolar transistors. In such a case, it is possible to obtain better constant current characteristics and high speed driving characteristics.

[Embodiment 9]

Figure 12:
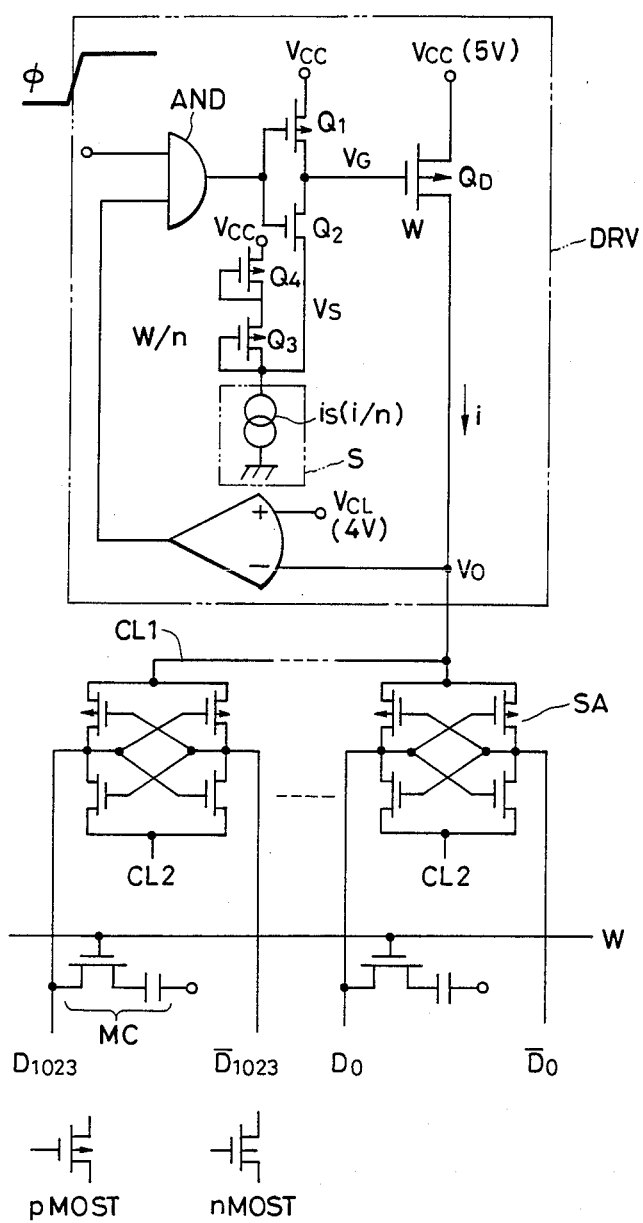

FIG. 12 shows the ninth embodiment of the present invention wherein the transistor constituting the current mirror consists of a plurality of MOS transistors $Q_3$ and $Q_4$. Since this embodiment can reduce the gate voltage of $Q_D$, a higher output power current can be produced by reducing the size of $Q_D$.

Figure 13:
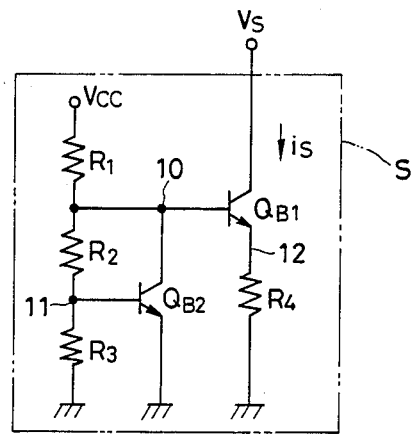

FIG. 13 shows a definite example of the constant current source S. This example consists of NPN bipolar transistors $Q_{B1}$, $Q_{B2}$ and resistors $R_1$ to $R_4$, and its operation will be explained. The base-emitter voltage $V_{BE}$ (ordinarily, 0.8 V) of $Q_{B2}$ appears at the node 11 and this voltage and $R_3$ determines the current flowing through $R_2$ and the voltage value at the node 10, as well. The voltage drop of $V_{BE}$ at the node 10 appears at the node 12 and this voltage and $R_4$ determines the current is It will now be assumed that $R_1=10$ Kohms, $R_2=4$ Kohms, $R_3=8$ Kohms and $R_4=4$ Kohms. Then, $V_{BE}=0.8$ V appears at the node 11. The current flowing through $R_2$ and $R_3$ becomes 0.8 V/8 Kohms=0.1 mA and the voltage value at the node 10 is 0.8 V +4 Kohms $\times 0.1$ mA = 1.2 V. The voltage at the node 12 is 1.2 V-0.8 V=0.4 V and the current is 0.4 V/4 Kohms=0.1 mA.

[Embodiment 10]

Figure 14:
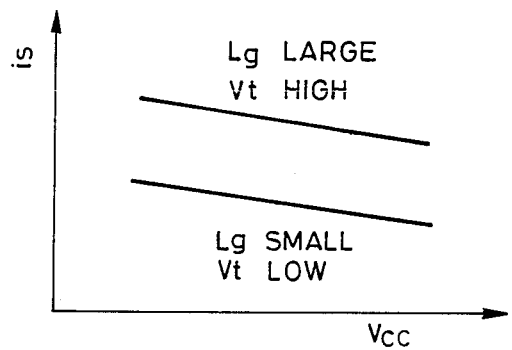

Since the ninth embodiment of the invention described above can utilize $V_{BE}$ of the bipolar transistors which hardly fluctuate between wafers and between lots, the influences of the fabrication process and the change of the power source voltage $V_{cc}$ are small. Since the voltage at the node 10 is determined by the ratio of resistance between $R_2$ and $R_3$, the constant current source becomes extremely stable without being affected by the fluctuation of the fabrication process. Even in the current mirror circuits incorporating therein such an extremely stable constant current source, MOST $Q_D$ shown in FIGS. 1 and 2 is preferably operated in the saturation region ($|V_o-V_{cc}| > |V_s-V_{cc}-V_T|$) in order to charge the data lines by the constant current. However, as shown in FIG. 3, this requirement cannot be satisfied with the passage of time depending on the operation conditions. In other words, if the potential of $V_o$ rises from $V_{CL}/2$ and becomes higher than the voltage $V_s-V_T$. (where $V_T$ is the threshold voltage of $Q_D$ and has generally a negative value because $Q_D$ is of the P-channel type), the relation becomes as $|V_o-V_{cc}| < |V_s-V_{cc}-V_T|$ and the MOS $Q_D$ operates in the non-saturation region. As a result, the current i becomes small and the time necessary for $V_o$ to reach $V_{DL}$ (4 V) becomes long. This tendency becomes all the more remarkable when the power source voltage $V_{cc}$ is as low as 4.4 V, the channel length $L_g$ of $Q_D$ is greater than the standard value and $V_t$ is high. If the power source voltage $V_{cc}$ is high, the channel length $L_g$ is smaller than the standard value and the threshold voltage $V_t$ is low, $Q_D$ operates in the saturation region but the time becomes faster than the necessary time and the peak current increases due to the drain-source voltage dependence of the drain current, and the like. This problem is likely to develop particularly in the embodiment shown in FIG. 12. Therefore, the current value i of the current source S is increased when the channel length $L_g$ is greater than the standard value and the threshold voltage $V_t$ is high, and is decreased when $L_g$ is smaller and $V_t$ is low, as shown in FIG. 14. The problem described above can be solved by further making a control in such a fashion that the current value becomes smaller with the higher power source voltage $V_{cc}$.

Figure 15:
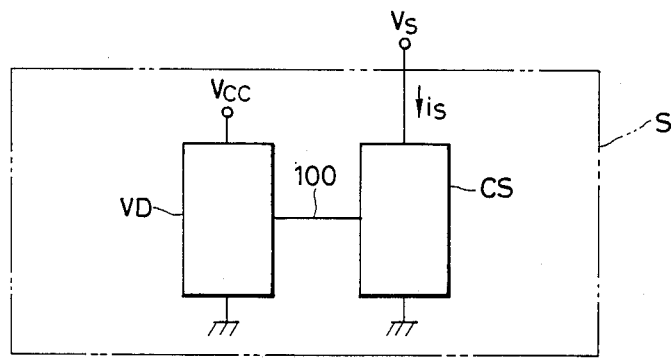

FIG. 15 shows an example of such an embodiment. It consists of a detection circuit VD for detecting the power source voltage $V_{cc}$, the channel length $L_g$ and the threshold voltage $V_t$ and a current source CS which receives the output signal 100 of the detection circuit VD and outputs the current $i_s$. When the power source voltage $V_{cc}$, the channel length $L_g$ and the threshold voltage $V_t$ change, the detection circuit VD for them controls the voltage value or current value of its output 100 to control CS and hence, $i_s$. When, for example, the power source voltage $V_{cc}$ is high, the channel length $L_g$ is smaller than the standard value and the threshold voltage $V_t$ becomes low, the voltage or current value of the output 100 is reduced to reduce $i_s$, and $i_s$ is increased when the condition is contrary.

According to this embodiment, it is possible to charge the data lines by the optimum current in conformity with the change of the power source voltage $V_{cc}$ or the fluctuation of the fabrication process of the channel length $L_g$ or the threshold voltage. Therefore, it is possible to reduce the peak current or to speed up the operation at the same peak current.

[Embodiment 11]

Figure 16:
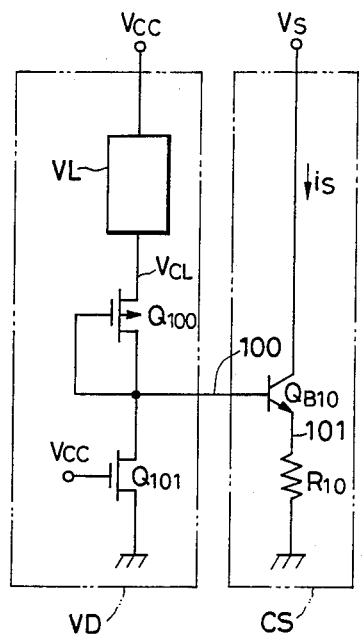

FIG. 16 shows the eleventh embodiment of the present invention. This embodiment comprises VD consisting of a constant voltage circuit $V_L$, a P-channel MOS $Q_{100}$ and an N-channel MOS $Q_{101}$ and CS consisting of an NPN bipolar transistor $Q_{B10}$ and a resistor $R_{10}$. The constant voltage circuit VL is of the type which uses the afore-mentioned voltage limiter circuit system and provides a constant output voltage $V_{DL}$ even when the power source voltage changes. Its operation is as folows. The ratio of drivability between $Q_{100}$ and $Q_{101}$ determines the voltage value of the node 100 and the balance between this voltage and the base emitter voltage $V_{BE}$ (0.8 V) of $Q_{B10}$ appears at the anode 101. This value and $R_{10}$ determines the current $i_s$. Assuming that $V_{cc}=V_{CL}=4$ V and the ratio of drivability of Q100 and Q101 is 1:1, the node 100 is 2 V and the node is 2 V−0.8 V=1.2 V. If $R_{10}$ is Kohms, $i_s=1.2$ V/12 Kohms=0.1 mA.

Under such a circuit connection, if the power source voltage $V_{cc}$ changes, the gate voltage of $Q_{101}$ changes, too, and drivability changes. When $V_{cc}$ becomes high, drivability becomes high and the voltage value at the node 100 drops. When $V_{cc}$ drops, drivability of $Q_{101}$ drops and the voltage at the node 100 becomes high. As a result, when $V_{cc}$ is high, it is possible to reduce $i_s$ and when the former is low, the latter can be increased.

According to this embodiment, the value of the current $i_s$ can be set freely by the ratio of drivability between $Q_{100}$ and $Q_{101}$ and the resistance value of $R_{10}$ Furthermore, when the power source voltage is high, the current value of $i_s$ can be reduced and when the former is low, the latter can be increased. As a result, it is possible to prevent the charging time of the data lines from becoming unnecessarily fast and the peak current from increasing.

Figure 17:
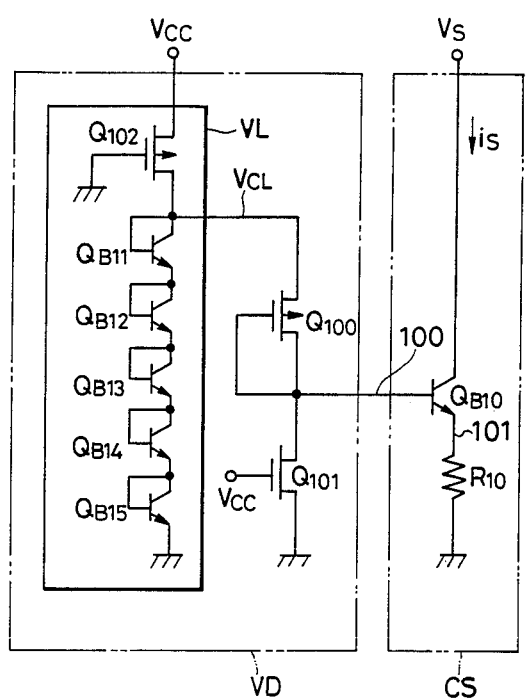

FIG. 17 shows the embodiment which illustrates definitely the constant voltage circuit VL shown in FIG. 16. VL consists of a P-channel MOS $Q_{102}$ and NPN bipolar transistors $Q_{B11} \sim Q_{B15}$. The operation of this circuit is as follows. When $V_{cc}$ is supplied and the voltage rises, $V_{CL}$ rises, too, through $Q_{102}$. When the voltage value of $V_{CL}$ reaches $0.8\ V \times 5$ ($V_{BE}$ of $Q_{B11} \sim Q_{B15}$)=4 V, $Q_{B11} \sim Q_{B15}$ become conductive and the rise of $V_{CL}$ stops and limited to the constant voltage 4 V. The other operations are the same as those of FIG. 16.

This embodiment illustrates definitely the constant voltage circuit.

[Embodiment 12]

Figure 18:
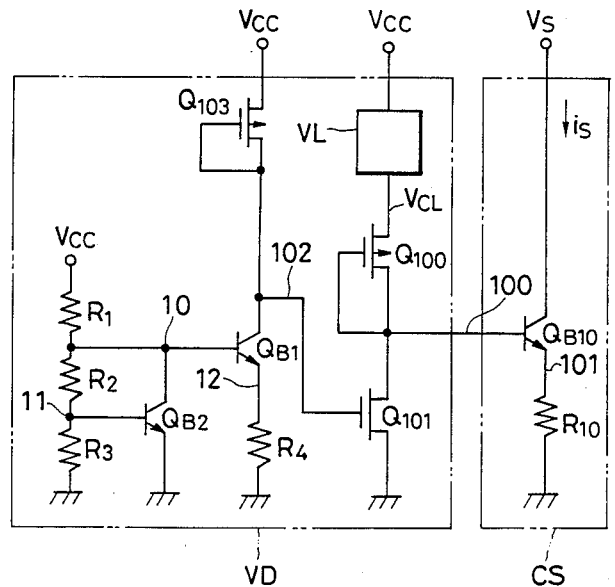

FIG. 18 shows the twelfth embodiment of the present invention when is formed by adding P-channel MOS $Q_{103}$, NPN bipolar transistors $Q_{B1} \sim Q_{B2}$ and resistors $R_1 \sim R_4$ to the circuit shown in FIG. 16. The circuit constituted by $Q_{B1}$, $Q_{B2}$ and $R_1 \sim R_4$ is the same constant current power source circuit as one shown in FIG. 13 and its operation is also the same. In this embodiment, the voltage value of the node 102 is determined by drivability of $Q_{103}$ and the current of the constant current source. Since the current of the constant current source does not have $V_{cc}$ dependence, this voltage value changes while following up $V_{cc}$. Furthermore, it can be changed by the fluctuation of the fabrication process of $L_g$ and $V_t$ of $Q_{102}$. In other words, when $L_g$ is smaller than the standard value and $V_t$ is low, drivability of $Q_{103}$ becomes great and the voltage value of the node 102 becomes high. It becomes low in the opposite case. The voltage of this node 102 is inputted to the gate of $Q_{101}$ and operates in the same way as in FIG. 17.

This embodiment can control not only the current value $i_s$ with the change of the power source voltage in the same way as in FIG. 16 but can control also the current $i_s$ with respect to the fluctuation of the fabrication process of $L_g$ and $V_t$, and the data lines can therefore be charged more stably.

[Embodiment 13]

FIG. 13 shows the thirteenth embodiment of the present invention. This embodiment comprises VD consisting of a constant voltage circuit VL and MOS $Q_{100} \sim Q_{106}$, $Q_{B16}$ and $R_{11}$, and CS consisting of $Q_{107}$. The operations of VL, $Q_{100}$, $Q_{101}$, $Q_{B10}$ and $R_{11}$ are the same as those of FIG. 17. In other words, when the power source voltage $V_{cc}$ becomes high, the value of the current flowing through the node 103 becomes small and when the former becomes low, the latter becomes great. The current source and transistors $Q_{104}$, $Q_{105}$ together constitute the current mirror circuit and a current which is the product of the current flowing through the node 103 by drivability of $Q_{105}$ (effective gate width/effective gate length)/drivability of $Q_{104}$ flows through the node 100. The output current $i_s$ is controlled by the second current mirror circuit consisting of $Q_{106}$ and $Q_{107}$. In this case, if the channel length $L_g$ of $Q_{105}$ is designed to such a great level that the fluctuation of the fabrication process can be neglected, it is possible to reflect the fluctuation of the fabrication process of $Q_{104}$ on the current value flowing through the node 100. In other words, if $L_g$ of $Q_{104}$ is small and $V_t$ is low, drivability of $Q_{104}$ becomes great and the voltage of the node 103 becomes high. If $L_g$ is smaller than the standard value and $V_t$ is high, on the contrary, the voltage of the node 103 becomes low. Since the gate length of $Q_{105}$ is designed to a level at which the fluctuation of their fabrication process can be neglated, the current of the node 100 is small in the former case and great in the latter and the same effect as FIG. 18 can be obtained. Needless to say, the same effect can be obtained likewise by increasing the gate length of $Q_{107}$.

This embodiment provides the same effect as in FIGS. 15 and 18.

[Embodiment 14]

Figure 19:
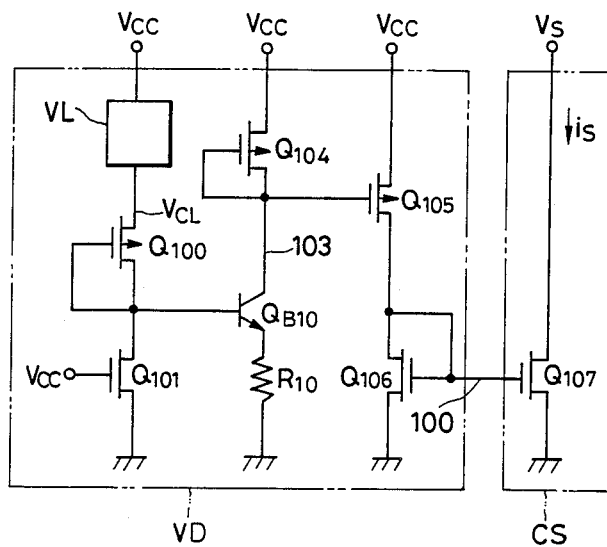
Figure 20:
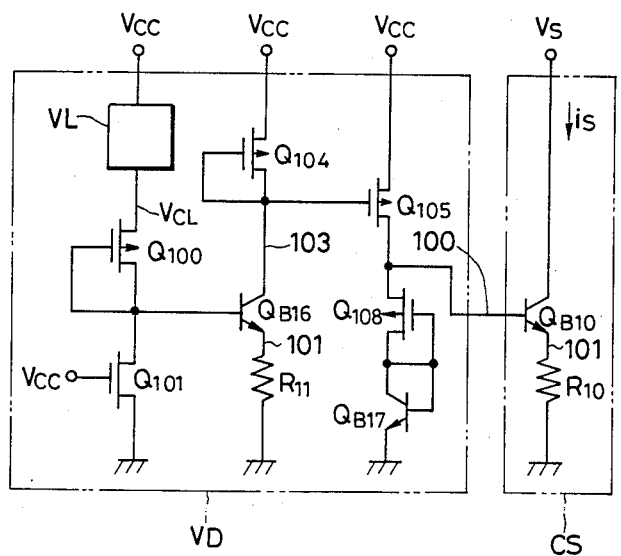

FIG. 20 shows the fourteenth embodiment of the present invention wherein $Q_{108}$, $Q_{B17}$, $Q_{110}$ and $R_{10}$ are added in place of $Q_{106}$ and $Q_{107}$ of FIG. 19. Only the other difference from FIG. 19 is that $L_g$ of $Q_{105}$ is equal to that of $Q_{104}$. The voltage of the node 100 is determined by $V_t$ of $Q_{108}$, $V_{BE}$ of $Q_{B17}$ and drivability of $Q_{105}$. It will be assumed hereby that both $L_g$ and $V_t$ are the standard values and $V_{cc}$, too, is the standard value of 5 V. Then, the ratio of drivability of $Q_{105}$, $Q_{108}$ and $Q_{B17}$ is determined so that only the sum voltage of $V_t$ of $Q_{108}$ and $V_{BE}$ of $Q_{B17}$ is outputted to the node 100 at this time. The voltage of the node 101 in this case is $V_t$ of $Q_{108}$ because $V_{BE}$ is cancelled, and this $V_t$ and $R_{10}$ determine $i_s$. When the power source voltage $V_{cc}$ drops, for example, the current flowing through the node 103 becomes great as described in the tenth embodiment and the current flowing through $Q_{105}$ forming the current mirror circuit becomes great, too. As a result, the voltage of the node 100 becomes high and $i_s$ becomes great. When $V_{cc}$ becomes high, $i_s$ becomes small, on the contrary. The fluctuation of the fabrication process of $V_t$ of $Q_{108}$ becomes as such the voltage of the node 101. Namely, the current $i_s$ becomes small when the value $L_g$ is smaller than the standard value and $V_t$ is low, and becomes great in the opposite case.

This embodiment provides the same effect as the effect shown in FIG. 19.

[Embodiment 15]

Figure 21:
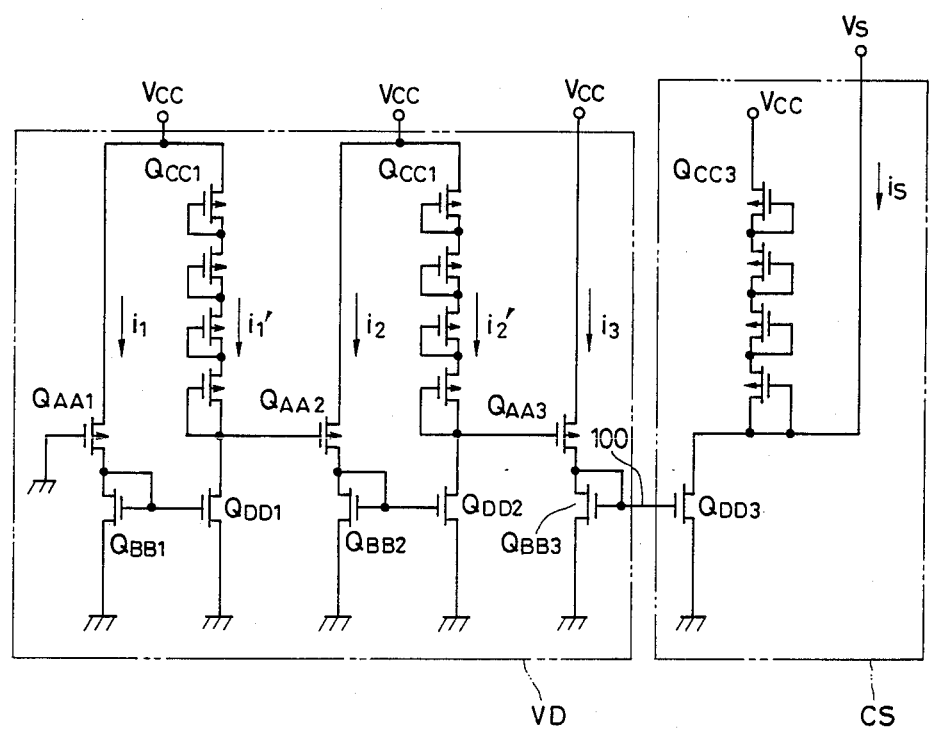

FIG. 21 shows the fifteenth embodiment of the present invention, wherein the circuits consisting of MOS transistors $Q_{AA}$, $Q_{BB}$, $Q_{CC}$ and $Q_{DD}$ are connected subsidiary to one another in three stages. The transistor constant of each stage is designed to be the same. The circuit operation is as follows. First of all, a very small predetermined current $i_1$, which slightly turns ON the four series P-channel MOS transistors, is caused to flow. Then, the drain source of each MOS transistor is biased to a voltage approximate to its threshold voltage Since the gate length of $Q_{CC1}$ is set to the same value as that of the output transistor $Q_D$ of the current mirror, the threshold voltage, too, becomes equal to the threshold voltage $V_t$ of $Q_D$. Therefore, an about 4 V voltage is applied across the gate and source of the P-channel MOS transistor $Q_{AA2}$. Since the gate length is set to a great value in the same way as in $Q_{AA2}$ and $Q_{AA1}$ in order to reduce the change of characteristics due to the fluctuation of the fabrication process, the current $i_2$ of $Q_{AA2}$ is dependent on $V_t$. In other words, when $V_t$ is high, $i_2$ becomes great and when $V_t$ is low, the current $i_2$ becomes small, too. This current $i_2$ is transmitted, as the current $i_2'$ of the series transistor $Q_{CC2}$ of the next stage, by the current mirror circuit consisting of N-channel transistors $Q_{BB2}$ and $Q_{DD2}$, and the same operation as described above is repeated Accordingly, $V_t$ dependence of the current $i$ becomes further great. This current is transmitted to the output terminal by the current mirror circuit consisting of $Q_{BB3}$ and $Q_{DD3}$. As a result, when the threshold voltage $V_t$ of the output transistor becomes high, the current $i_s$ becomes great and when $V_t$ drops, on the contrary, the current $i_s$ becomes small, thereby providing desired current characteristics. In this manner, the problem of the drop of the output current $i$ in the operation region of MOS transistors can be mitigated.

The foregoing embodiments illustrate the embodiments wherein the current is made constant by the combination with the voltage limiter using the comparator. However, when the voltage limiter is not used (where the output loop of the comparator does not exist), the mirror circuit can be controlled by the input pulse $\phi$ so that the current can be made constant Since the output voltage $V_o$ can be made unlimitedly close to $V_{CL}$ by making the response time of the comparator faster than that of the output $V_o$, the comparator can be constituted by use of bipolar transistors suitable for a high speed operation, depending upon the intended application. The concept of the present invention can be applied to driving of the common driving line CL2 of the sense amplifier constituted by n-MOS transistors, and the charging waveform and discharging waveform can be controlled arbitrarily by so doing. If both of these waveforms are made completely complementary to each other, the noise coupling with other conductors (such as the Si substrate and the word lines) from the data lines can be offset completely and a memory having a broad operation margin can be designed.

Furthermore, the present invention is not particularly limited to the application to the data line charge circuit of DRAM but can be used effectively as the countermeasure for the peak current when applied to the data output portions of all the memories having a multi-bit structure (the structure wherein a plurality of data outputs are outputted from one chip) or the address output portion of microcomputers where the peak current becomes a problem, in particular.

The charge/discharge current, that has been left as such conventionally, can be controlled arbitrarily in accordance with the present invention by controlling the current value of the constant current source of the current mirror circuit as described above. Therefore, the noise inside the LSI chip can be reduced, chip design can be made more easily and the noise from the chip mounted actually onto a card can be reduced on the user side so that card design can be made more easily, too. Since the output pulse of a low and constant voltage can be obtained, the consumed power of the chip can be reduced, too.

It is further understood by those skilled in the art that the foregoing description is the preferred embodiments of the disclosed invention and that various changes and modifications may be made in the invention without departing from the spirit and scope thereof.

We claim:

1. A driver circuit characterized by including at least one current mirror circuit which is controlled by a pulse input signal and an output current of which drives a load, wherein said current mirror circuit includes a first MOS transistor and a second MOS transistor, the sources of said first MOS transistor and said second MOS transistor being supplied with an operating potential, the drain of said first MOS transistor being connected electrically to said load to be driven by said output current, the gate and the drain of said second MOS transistor being electrically connected to a current source, and the gate of said first MOS transistor and the gate of said second MOS transistor being connected electrically to one another through first means which is controlled by said pulse signal.

2. A driver circuit according to claim 1, wherein the output voltage of said load is compared with a predetermined reference voltage by a comparator, and said current mirror circuit is controlled by an output signal of said comparator.

3. A driver circuit according to claim 1, wherein the source of said first MOS transistor is connected electrically to a voltage limiter circuit.

4. A driver circuit according to claim 1, wherein said load exists outside a semiconductor chip in which said driver circuit is disposed.

5. A driver circuit according to claim 1, which further comprises a discharge circuit which includes at least another current mirror circuit controlled by said pulse input signal and which discharges said load by an output current of said other current mirror circuit.

6. A driver circuit according to claim 1, which further comprises voltage reduction means disposed between the source of said second MOS transistor and said operating potential.

7. A driver circuit according to claim 1, wherein said current source includes control means for controlling a current value of said current based on a change in at least one of the values of the operating potential, and a channel length and a threshold voltage of said first and second MOS transistors.

8. A driver circuit according to claim 7, wherein said control of said current value is made in such a manner that the current of said current source is increased when said channel length is great or when said threshold voltage is high, and is reduced when said channel length is small or said threshold voltage is low.

9. A dynamic random access memory comprising:

a word line;

a plurality of data line pairs disposed in such a manner as to intersect said word line;

dynamic memory cells disposed at the intersections between said word line and said plurality of data line pairs, wherein each of said dynamic memory cells includes a MOS transistor connected at its gate electrode to said word line, and a capacitor connected at one electrode thereof to a corresponding data line through a drain-source path of said MOS transistor;

a plurality of sense amplifier means each of which is coupled to each pair of said plurality of data line pairs, wherein each of said plurality of sense amplifier means includes a first p-channel MOS transistor and a second p-channel MOS transistors, wherein the sources of said first and said second p-channel MOS transistors are commonly connected, wherein the drain of said first p-channel MOS transistor and the gate of said second p-channel MOS transistor are coupled to one line of said each pair, and wherein the drain of said second p-channel MOS transistor and the gate of said first p-channel MOS transistor are coupled to another line of said each pair; and a driver circuit, an output current of which drives said sources of said first and said second p-channel MOS transistors of said plurality of sense amplifier means in response to a pulse input signal, wherein said driver circuit includes a current mirror circuit which is controlled by said pulse input signal, and wherein said current mirror circuit includes a first MOS transistor and a second MOS transistor, wherein the sources of said first MOS transistor and said second MOS transistor are supplied with an operating potential, wherein the drain of said first MOS transistor is connected electrically to said sources of said first and said second p-channel MOS transistors of said plurality of sense amplifier means, wherein the gate and the drain of said second MOS transistor are connected electrically to a current source, and wherein the gate of said first MOS transistor and the gate of said second MOS transistor are connected electrically to one another through first means which is controlled by said pulse signal.

10. A dynamic random access memory according to claim 9, wherein a voltage at said sources of said first and said second p-channel MOS transistors of said plurality of sense amplifier means is compared with a predetermined reference voltage by a comparator, and said current mirror circuit is controlled by an output signal of said comparator.

11. A dynamic random access memory according to claim 9, wherein said source of said first MOS transistor of said current mirror circuit in said driver circuit is connected electrically to a voltage limiter circuit.

* * * * *